United States Patent
Garnett et al.

(10) Patent No.: US 6,838,350 B2
(45) Date of Patent: Jan. 4, 2005

(54) TRIPLY IMPLANTED COMPLEMENTARY BIPOLAR TRANSISTORS

(75) Inventors: Martin E. Garnett, Los Gatos, CA (US); Peter Zhang, San Jose, CA (US); Steve McCormack, Cupertino, CA (US); Ji-hyoung Yoo, Cupertino, CA (US)

(73) Assignee: Micrel, Inc., San Jose, CA (US)

( * ) Notice: Subject to any disclaimer, the term of this patent is extended or adjusted under 35 U.S.C. 154(b) by 25 days.

(21) Appl. No.: 10/424,004

(22) Filed: Apr. 25, 2003

(65) Prior Publication Data

US 2004/0212043 A1 Oct. 28, 2004

(51) Int. Cl.⁷ .................... H01L 21/8222; H01L 29/732
(52) U.S. Cl. ................. 438/369; 257/592; 257/593; 438/322
(58) Field of Search ................. 438/322–327, 438/369–377; 257/565–593

(56) References Cited

U.S. PATENT DOCUMENTS

| | | | |
|---|---|---|---|
| 4,994,881 A | * 2/1991 | Gomi | 257/518 |
| 5,580,798 A | 12/1996 | Grubisich | 437/34 |
| 5,581,115 A | * 12/1996 | Grubisich et al. | 257/592 |
| 5,698,459 A | 12/1997 | Grubisich et al. | 437/31 |
| 5,880,516 A | 3/1999 | Yamazaki | 257/558 |
| 6,093,613 A | 7/2000 | Verma et al. | 438/309 |
| 6,130,136 A | 10/2000 | Johnson et al. | 438/365 |
| 6,222,250 B1 | * 4/2001 | Gomi | 257/574 |

OTHER PUBLICATIONS

Tadanori Yamaguchi et al., "Process and Device Optimization of an Analog Complementary Bipolar IC Technology With 5.5–Ghz $f_t$ PNP Transistors", IEEE Transactions On Electron Devices, vol. 41, No. 6, Jun. 1994, pp 1019–1025.

* cited by examiner

Primary Examiner—Long Pham
Assistant Examiner—Marcos D. Pizarro-Crespo
(74) Attorney, Agent, or Firm—Patent Law Group LLP; Carmen C. Cook

(57) ABSTRACT

A method for fabricating a bipolar transistor includes forming a first region of a first conductivity type in a semiconductor structure to form a collector region and forming a second region of a second conductivity type in the first region to form a base region. A first mask is applied including an opening defining an emitter region of the bipolar transistor. The method further includes a triple implantation process using the first mask. Thus, a third region of the first conductivity type is formed in the first region and overlaid the second region. A fourth region of the second conductivity type is formed in the second region and is more heavily doped than the second region. A fifth region of the first conductivity type is formed in the second region and above the fourth region. The fifth region forms the emitter region of the bipolar transistor.

14 Claims, 15 Drawing Sheets

SWELL

SWELL

TRIPLY IMPLANTED COMPLEMENTARY BIPOLAR TRANSISTORS

FIELD OF THE INVENTION

The invention relates to semiconductor devices and, in particular, the present invention relates to bipolar transistors, including structures and methods for manufacturing the same.

DESCRIPTION OF THE RELATED ART

Bipolar transistors are used in integrated circuits for providing high frequency switching functions. Conventional complementary bipolar transistor fabrication processes often use polysilicon emitters where the emitters are formed in a polysilicon layer above the substrate instead of in a diffusion region in the substrate. When a fabrication process integrates both bipolar and MOS transistors, vertical NPN or PNP bipolar transistors are often used. FIGS. 1A and 1B are cross-sectional view of a conventional vertical NPN (VNPN) transistor and a conventional vertical PNP (VPNP) transistor, respectively.

When bipolar transistors are operated at high current and low collector to emitter voltages ($V_{CE}$), the transistor can enter quasi-saturation where the base is "electrically" pushed out into the collector, increasing the effective base width of the transistor. As a result, the effective current gain, β, of the transistor and the cut-off frequency, $f_T$, are reduced. The base push out effect is also referred to as the Kirk effect. In bipolar transistors fabricated using a poly emitter process, an implant (sometimes referred to as a "Kirk implant") is introduced at the base to collector junction to counteract the Kirk effect and limit the amount of base push-out.

However, vertical bipolar transistors with improved current gain and improved cut-off frequency $f_T$ are desired.

SUMMARY OF THE INVENTION

According to one embodiment of the present invention, a method for fabricating a bipolar transistor includes forming a first region of a first conductivity type in a semiconductor structure to form a collector region of the bipolar transistor, forming a second region of a second conductivity type in the first region to form a base region of the bipolar transistor, and applying a first mask over the semiconductor structure where the first mask includes an opening defining an emitter region of the bipolar transistor. The method further includes, using the first mask, forming a third region of the first conductivity type in the semiconductor structure. The third region is formed in the first region and overlaid the second region. Then, using still the first mask, the method includes forming a fourth region of the second conductivity type in the semiconductor structure. The fourth region is formed in the second region and is more heavily doped than the second region. A lower portion of the fourth region is overlaid by the third region. Finally, using still the first mask, the method includes forming a fifth region of the first conductivity type in the semiconductor structure. The fifth region is formed in the second region and above the fourth region. The fifth region forms the emitter region of the bipolar transistor.

In one embodiment, the third, fourth and fifth regions are formed by ion implantation using the first mask followed by subsequent anneal.

The bipolar transistor thus fabricated includes an intrinsic base region with a reduced basewidth. Thus, the bipolar transistor exhibits improved device characteristics including current gain and cut-off frequency.

The present invention is better understood upon consideration of the detailed description below and the accompanying drawings.

DETAILED DESCRIPTION OF THE PREFERRED EMBODIMENTS

In accordance with the principles of the present invention, a vertical bipolar transistor employs a triple implantation process using an opening defining the emitter region to form a selective collector region, an intrinsic base region and the emitter region in the transistor. The vertical bipolar transistor thus formed realizes a level base doping profile and a reduced base width. Thus, the vertical bipolar transistor of the present invention demonstrates improved device characteristics including improved current gain β, improved cut-off frequency $f_T$, and improved early voltage Va. When the proper implant doses and energies are used, the β*Va product of the vertical bipolar transistor can be increased and the breakdown voltage BVCEO of the transistor is lowered.

Specifically, by selecting the appropriate implant doses and energies of the intrinsic base and selective collector implants, the basewidth of the vertical bipolar transistor of the present invention can be reduced to 40 to 70% that of conventional vertical bipolar transistors. The narrower basewidth results in faster base transit time, and the total cut-off frequency $f_T$ of the vertical bipolar transistor can be improved by a factor of 2 or more.

FIGS. 2–10 illustrate the fabrication process sequence for forming a vertical NPN (VNPN) transistor and a vertical PNP (VPNP) transistor according to one embodiment of the present invention. FIGS. 11A, 11B, 12A and 12B are cross-sectional views of the final transistor structure of the VNPN and VPNP transistors. In the present illustration, process steps for forming complementary bipolar transistors are described. However, one of ordinary skill in the art will appreciate that selected process steps can be used when only one type of transistors is desired. Furthermore, the following description includes process steps not necessary for the formation of the bipolar transistors but are used for isolation of the transistors or for improving certain electrical characteristics of the transistors. One of ordinary skill in the art would appreciate that certain process steps described below are not necessary for the practice of the present invention and may be included or discarded depending on the final transistor characteristics desired. Moreover, process particulars mentioned herein, such as the materials used, the layer thicknesses, doping concentrations and implant energies used, are illustrative only and are not intended to limit the present invention.

Figure 1A:
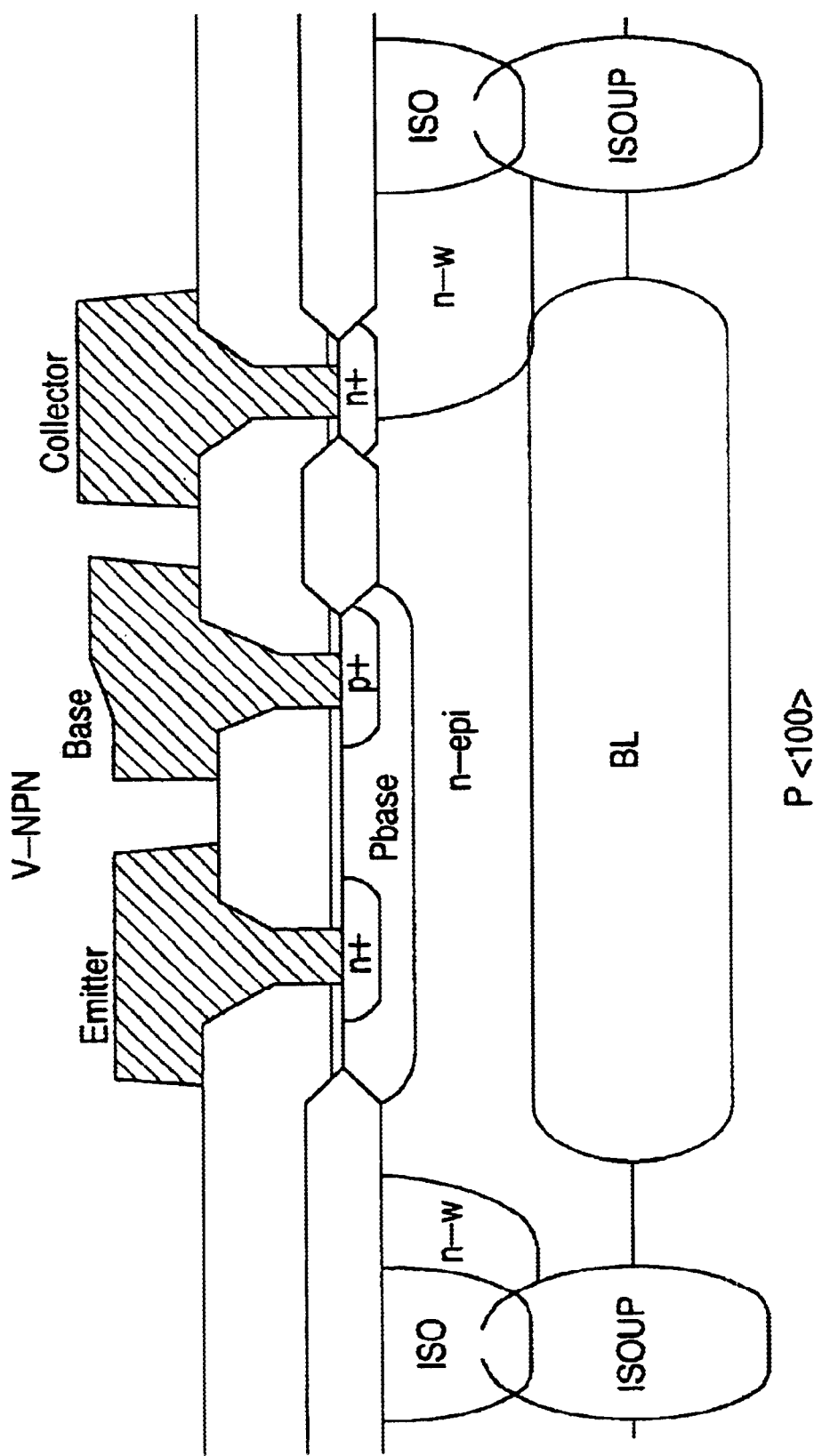
FIGS. 1A and 1B are cross-sectional view of a conventional vertical NPN (VNPN) transistor and a conventional vertical PNP (VPNP) transistor, respectively.
Figure 1B:
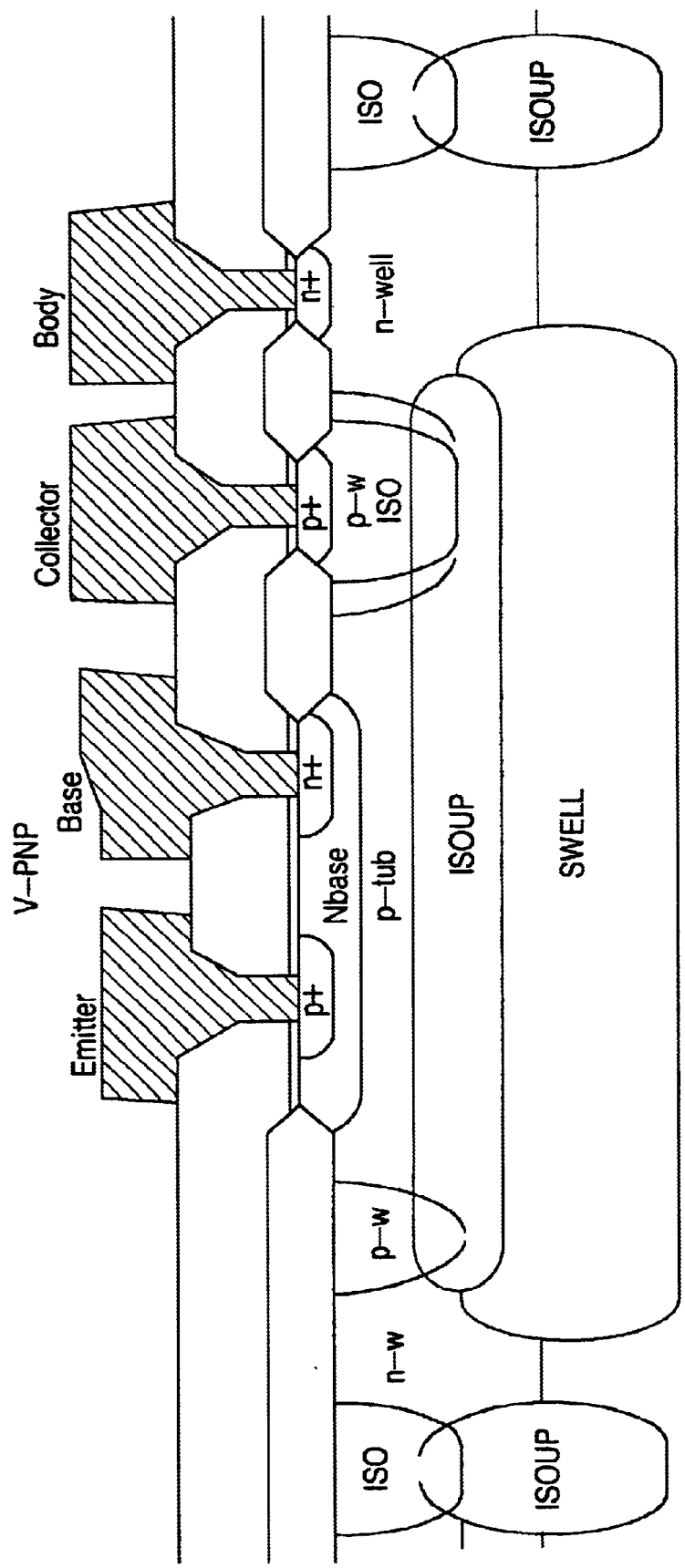
Figure 2:
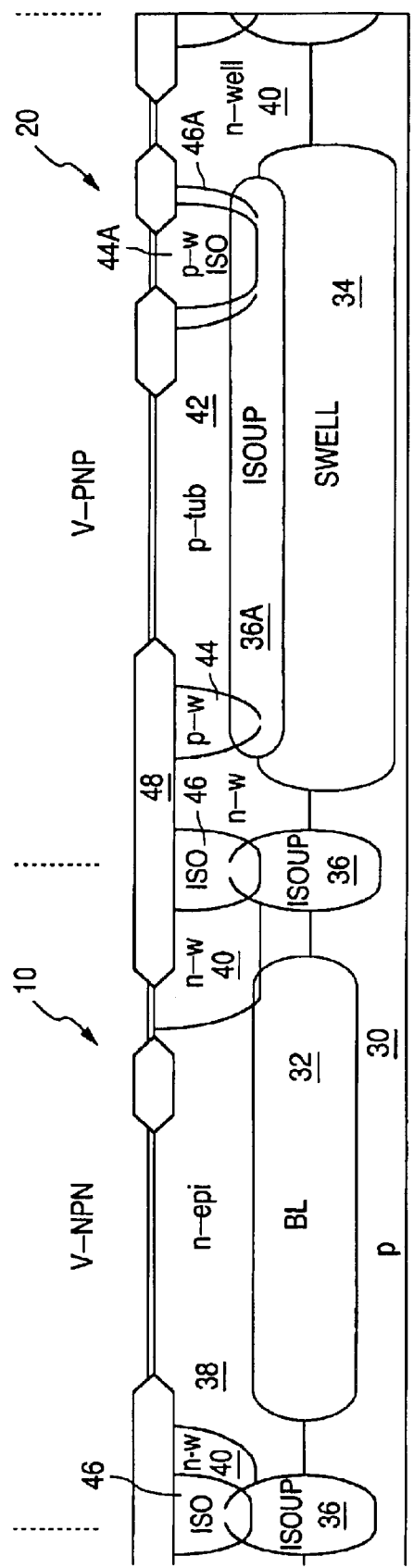
FIGS. 2–10 illustrate the fabrication process sequence for forming a vertical NPN (VNPN) transistor and a vertical PNP (VPNP) transistor according to one embodiment of the present invention.

FIG. 2 illustrates the initial steps of the fabrication process of a semiconductor structure including a region 10 for forming a VNPN transistor and a region 20 for forming a VPNP transistor. The fabrication process starts with a P-type substrate 30. A buried layer 32 is formed on substrate 30 using conventional masking and implantation steps. Buried layer 32 is implanted with N-type dopants (such as antimony) and is formed in region 10. Buried layer 32 functions to reduce the collector resistance of the VNPN transistor to be formed. Following the implantation of buried layer 32, a SWELL 34 is formed on substrate 30 in region 20 using conventional masking and implantation steps. SWELL 34 is implanted with N-type dopants (such as phosphorous) and functions to isolate the VPNP transistor to be formed from substrate 30. An anneal (or drive-in) step is usually carried out after the implantation steps to diffuse the implanted dopants at buried layer 32 and SWELL 34.

Next, ISOUP regions 36 are formed using conventional masking and implantation steps. ISOUP regions 36 are implanted with P-type dopants (such as boron) and are formed at selected locations of the semiconductor structure for providing lateral device isolation. In addition, in region 20, an ISOUP region 36A is formed for reducing the collector resistance of the VPNP transistor to be formed. After the implantation step, a drive-in process can be carried out to diffuse the implanted dopants.

Following the formation of ISOUP regions 36, an N-type epitaxial layer (N-Epi) 38 is formed in a conventional manner, such as by standard epitaxial growth techniques. In the present illustration, the thickness of N-Epi layer 38 is about 7.5 $\mu$m. N-Epi layer 38 in region 10 forms the collector region of the VNPN transistor to be formed.

Following formation of N-Epi layer 38, N-wells 40 may be optionally formed in the semiconductor structure. In the present illustration, N-wells 40 are formed to provide isolation and to improve the device breakdown characteristics at the N-Epi and ISO/ISOUP junctions. Then, a P-tub 42 is formed in N-Epi layer 38 in region 20 which functions as the collector region of the VPNP transistor to be formed. In addition to N-wells 40, P-wells 44 may be optionally formed in the semiconductor structure. In the present illustration, a P-well 44A in region 20 is used to provide a low resistance collector contact for the VPNP transistor. N-wells 40, P-tub 42 and P-wells 44 can be formed using conventional masking and implantation steps. A drive-in step usually follows to diffuse the implanted dopants. After the drive-in process, P-well 44A diffuses into ISOUP region 36A for providing a contiguous low resistance path for the collector region of the VPNP transistor to be formed.

Followings the wells and tubs formation, ISO regions 46 are formed in the semiconductor structure. ISO regions 46 can be formed using conventional masking, implantation and drive-in steps. ISO regions 46 are implanted with p-type dopants and are formed above ISOUP regions 36 at selected locations of the semiconductor structure for providing lateral device isolation. In region 20, ISO region 46A is formed at the same location as P-well 44A and functions to further reduce the resistance of the collector contact of the VPNP transistor to be formed.

Next, the active areas of the semiconductor structure are defined by masking the active areas and performing a field oxidation process. Before the field oxidation process, a field implant may be performed to form heavily doped p+ regions (B-field regions) underneath the field oxide regions. The B-field regions (not shown) function to increase field threshold voltage at the respective locations. FIG. 2 illustrates the semiconductor structure after the field oxidation process where active areas of the transistors are bounded by a field oxide layer 48.

Figure 3:
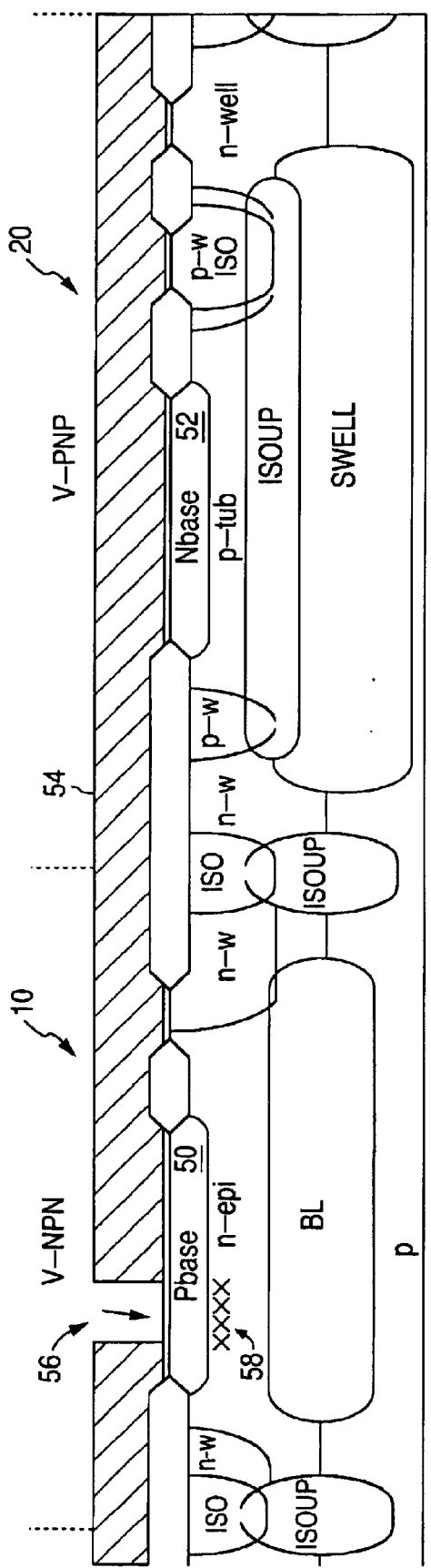

Following definition of the active areas, the base regions of the VNPN and VPNP transistors can now be formed. Referring now to FIG. 3, P-base 50 is formed in region 10 using conventional masking and implantation steps. P-base 50 can be implanted using boron. P-base 50 forms the base region of the VNPN transistor to be formed. N-base 52 is formed in region 20 also using conventional masking and implantation steps. N-base 52 can be implanted using phosphorous. N-base 52 forms the base region of the VPNP transistor to be formed. A drive-in step is usually carried out after the P-base and N-base implantation to diffuse the implanted dopants.

After the base regions are formed, emitter masks for the VNPN and VPNP transistors, respectively, are applied to define and form the emitter region. In accordance with the present invention, with the emitter mask for each transistor type applied, a triple implantation is performed to define a selective collector region, an intrinsic base region and an emitter region in the bipolar transistor.

Referring to FIG. 3, an emitter mask 54 defining an emitter opening 56 in region 10 is formed on the semiconductor structure. Emitter opening 56 defines the emitter region for the VNPN transistor to be formed. Using emitter opening 56, a first implantation, also referred to as the "Kirk implant", is performed to form a selective collector region in the collector of the VNPN transistor. Specifically, implantation using N-type dopants is performed at an energy level that places the implanted dopants 58 in N-Epi 38 near the bottom of the P-base 50 junction. In one embodiment, the selective collector region implantation is performed using phosphorous at a dose of $1.33 \times 10^{12}$ atoms/cm$^2$ and at an implant energy of 420 KeV. When subsequently annealed, implanted dopants 58 form a heavily doped collector region at the base to collector junction of the VNPN transistor having the effect of countering the base-push out effect experienced by the transistor in operation.

Figure 4:
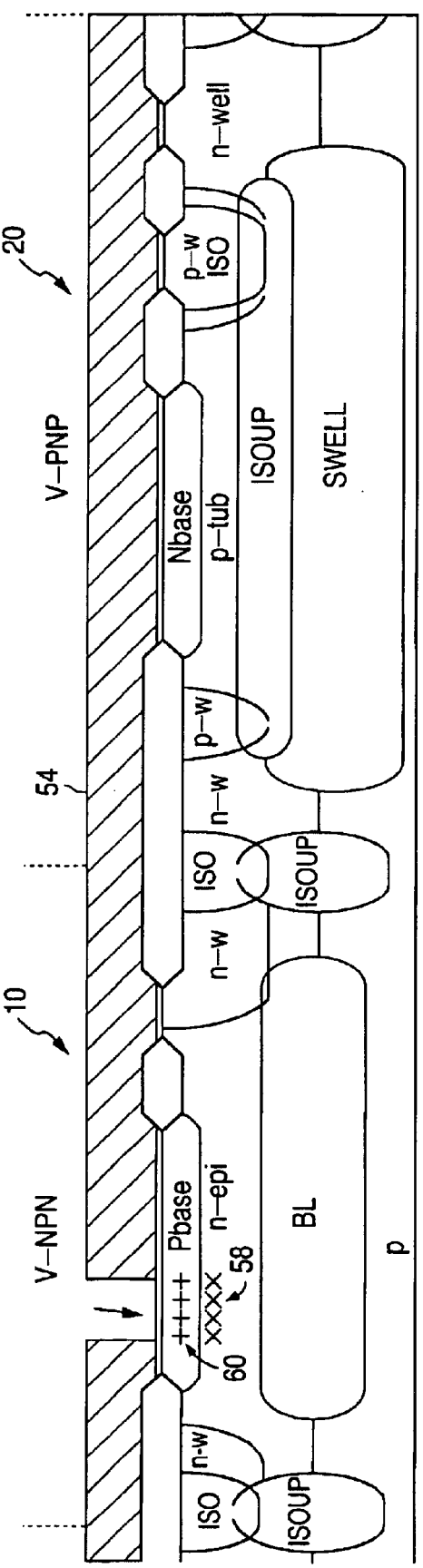

Again, using emitter mask 54 with emitter opening 56, a second implantation is performed to form an intrinsic base region in P-base 50 (FIG. 4). The implantation is performed using P-type dopants and is carried out at an energy level that places the implanted dopants 60 in P-base 50. In one embodiment, the intrinsic base region implantation is performed using boron at a dose of $2 \times 10^{12}$ atoms/cm$^2$ and at an implant energy of 110 KeV. When subsequently annealed, implanted dopants 60 forms an intrinsic base region in P-base 50, as will be described in more detail below.

Figure 5:
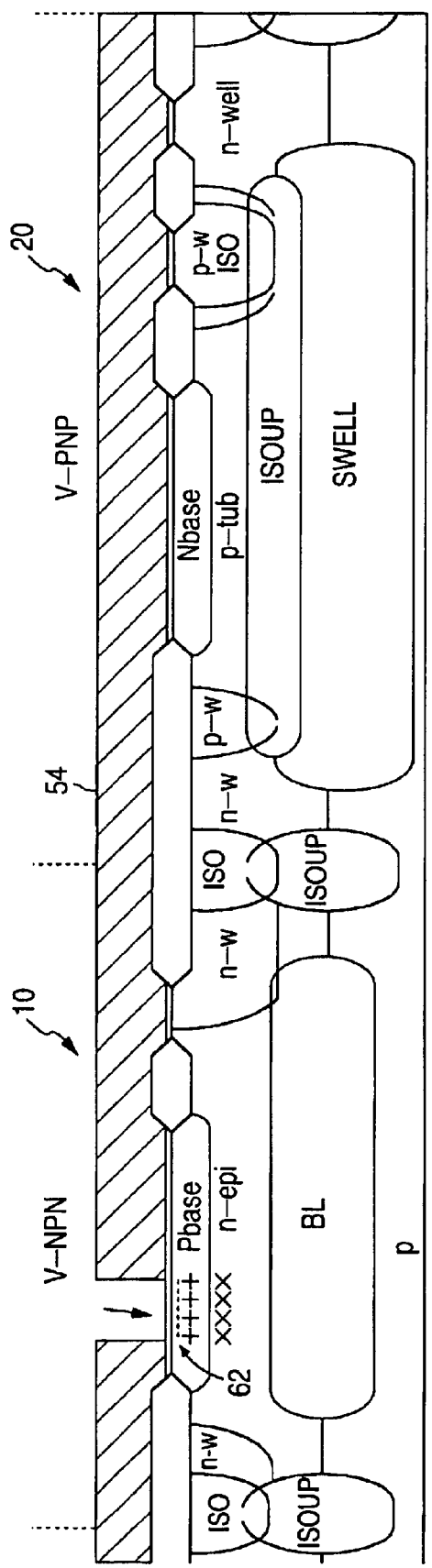

Finally, using emitter mask 54 with emitter opening 56, a third implantation is performed to form the emitter region of the VNPN transistor (FIG. 5). The implantation is performed using N-type dopants and is carried out at an energy level that places the implanted dopants 62 near the surface of the semiconductor structure. The emitter implantation can be performed in a conventional manner, using one implantation step or using a series of implantations steps, depending on the fabrication process.

After the triple sequential implantation process, an anneal can be performed to drive-in the implanted dopants. In the present illustration, because complementary bipolar transistors are to be formed, the anneal process is deferred until the triple implantation process for the VPNP transistor is also completed.

Figure 6:
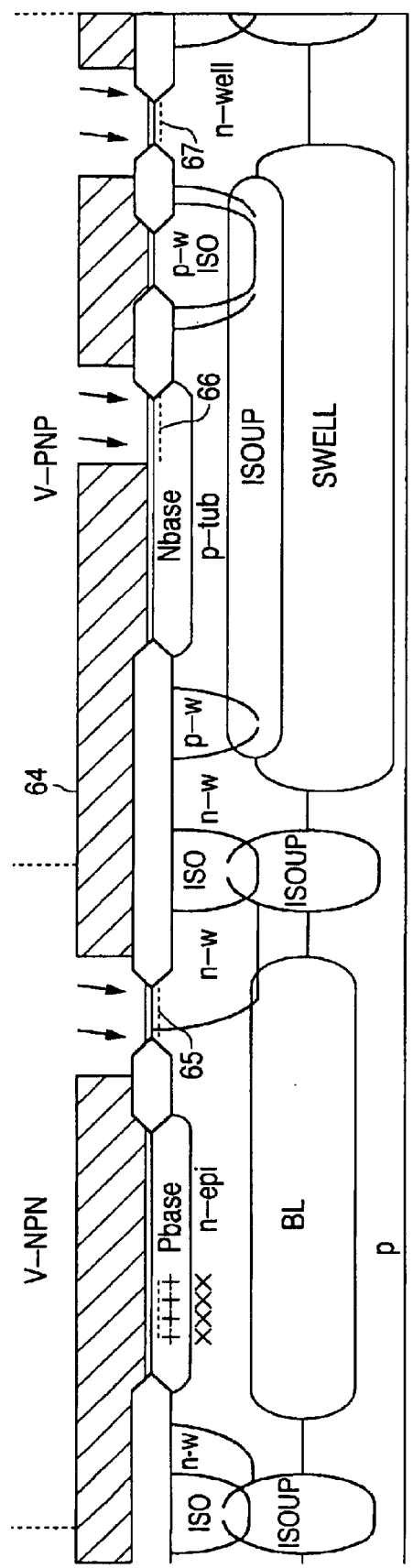

After the emitter region is implanted, implantation may also be carried out to form contact diffusion in other areas of the semiconductor structure. Referring to FIG. 6, an N+ implant mask 64 is applied and implantation using N-type dopants is performed. The N+ implantation process, after subsequent anneal, forms a diffusion region 65 in region 10 which functions as the collector contact diffusion, a diffusion region 66 in region 20 which functions as the base contact diffusion, and a diffusion region 67 in region 20 which functions as the substrate-well contact for the VPNP transistor to be formed.

Figure 7:
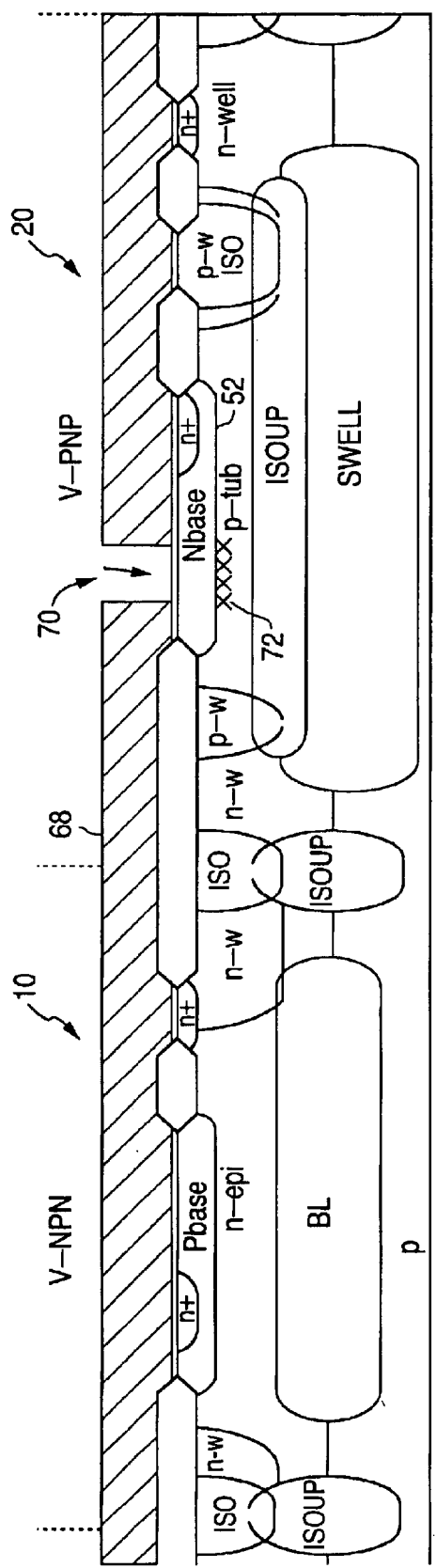

The triple implantation process is now applied to region 20 to form a selective collector region, an intrinsic base region and an emitter region of the VPNP transistor. Referring to FIG. 7, an emitter mask 68 defining an emitter opening 70 in region 20 is formed on the semiconductor structure. Emitter opening 70 defines the emitter region for the VPNP transistor to be formed. Using emitter opening 70, a first implantation (the "Kirk implant") is performed to form a selective collector region in the collector of the VPNP transistor. Specifically, implantation using P-type dopants is performed at an energy level that places the implanted dopants 72 in P-tub 42 near the bottom of the N-base 52 junction. In one embodiment, the selective collector region implantation is performed using boron at a dose of $3 \times 10^{12}$ atoms/cm$^2$ and at an implant energy of 360 KeV. When subsequently annealed, implanted dopants 72 form a heavily doped collector region at the base to collector junction of the VPNP transistor having the effect of countering the base-push out effect experienced by the transistor in operation.

Figure 8:
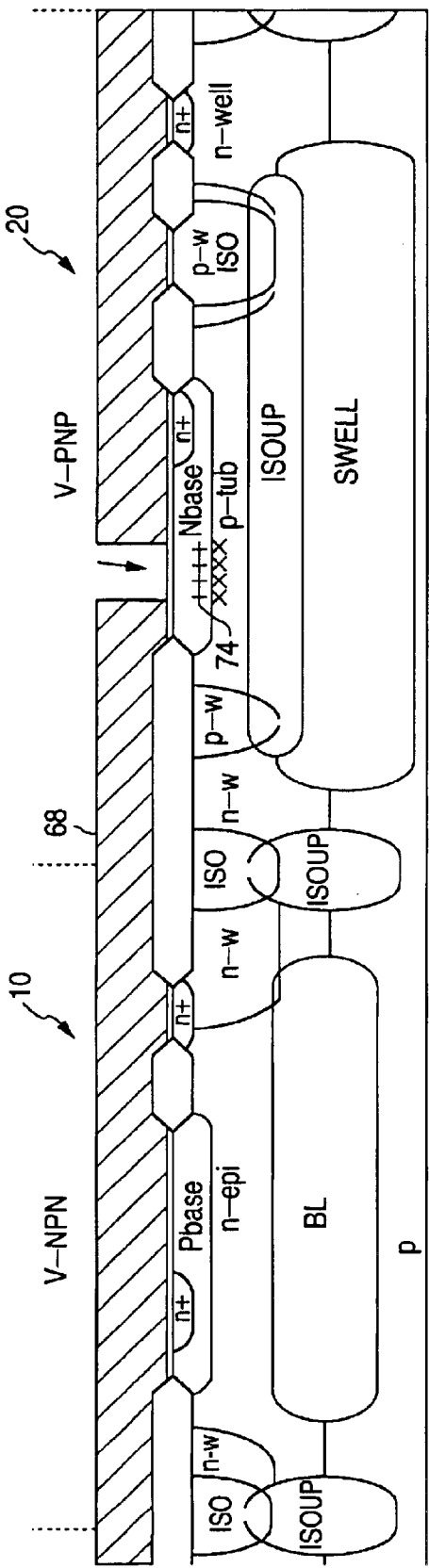

Using again emitter mask 68 with emitter opening 70, a second implantation is performed to form an intrinsic base region in N-base 52 (FIG. 8). The implantation is performed using N-type dopants and is carried out at an energy level that places the implanted dopants 74 in N-base 52. In one embodiment, the intrinsic base region implantation is performed using phosphorous at a dose of $2 \times 10^{13}$ atoms/cm$^2$ and at an implant energy of 495 KeV. When subsequently annealed, implanted dopants 74 forms an intrinsic base region in N-base 52, as will be described in more detail below.

Figure 9:
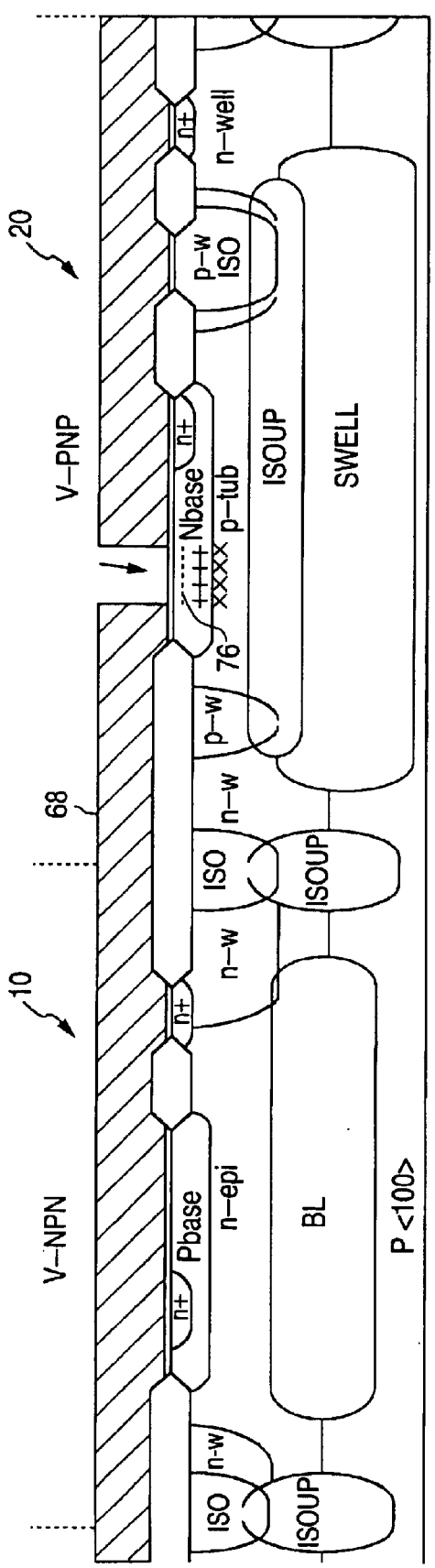

Finally, using emitter mask 68 with emitter opening 70, a third implantation is performed to form the emitter region of the VPNP transistor (FIG. 9). The implantation is performed using P-type dopants and is carried out at an energy level that places the implanted dopants 76 near the surface of the semiconductor structure. The emitter implantation can be performed in a conventional manner, using one implantation step or using a series of implantations steps, depending on the fabrication process.

Figure 10:
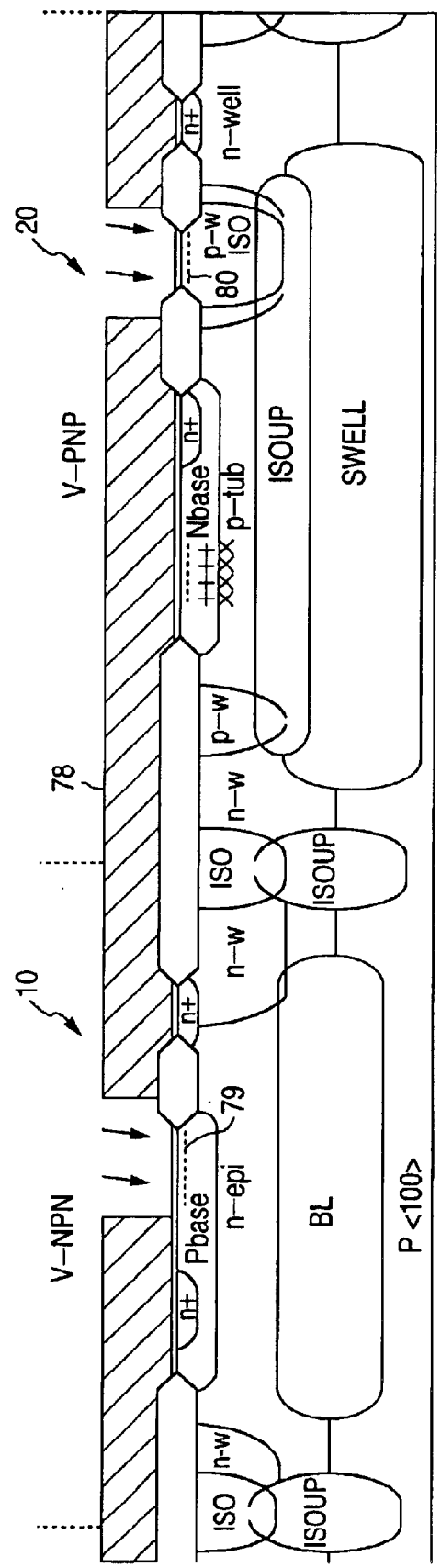

After the emitter region of the VPNP transistor is defined, implantation may also be carried out to form contact diffusion in other areas of the semiconductor structure. Referring to FIG. 10, an P+ implant mask 78 is applied and implantation using P-type dopants is performed. The P+ implantation process, after subsequent anneal, forms a diffusion region 79 in region 10 which functions as the base contact diffusion and a diffusion region 80 in region 20 which functions as the collector contact diffusion.

An anneal process can now be carried out to diffuse the implanted dopants. Subsequently, conventional processing steps can be carried out to encapsulate the semiconductor structure with an insulating layer, such as a BPSG layer, and to form contact holes where metallization contacts to the terminals of the bipolar transistors can be made.

Figure 11A:
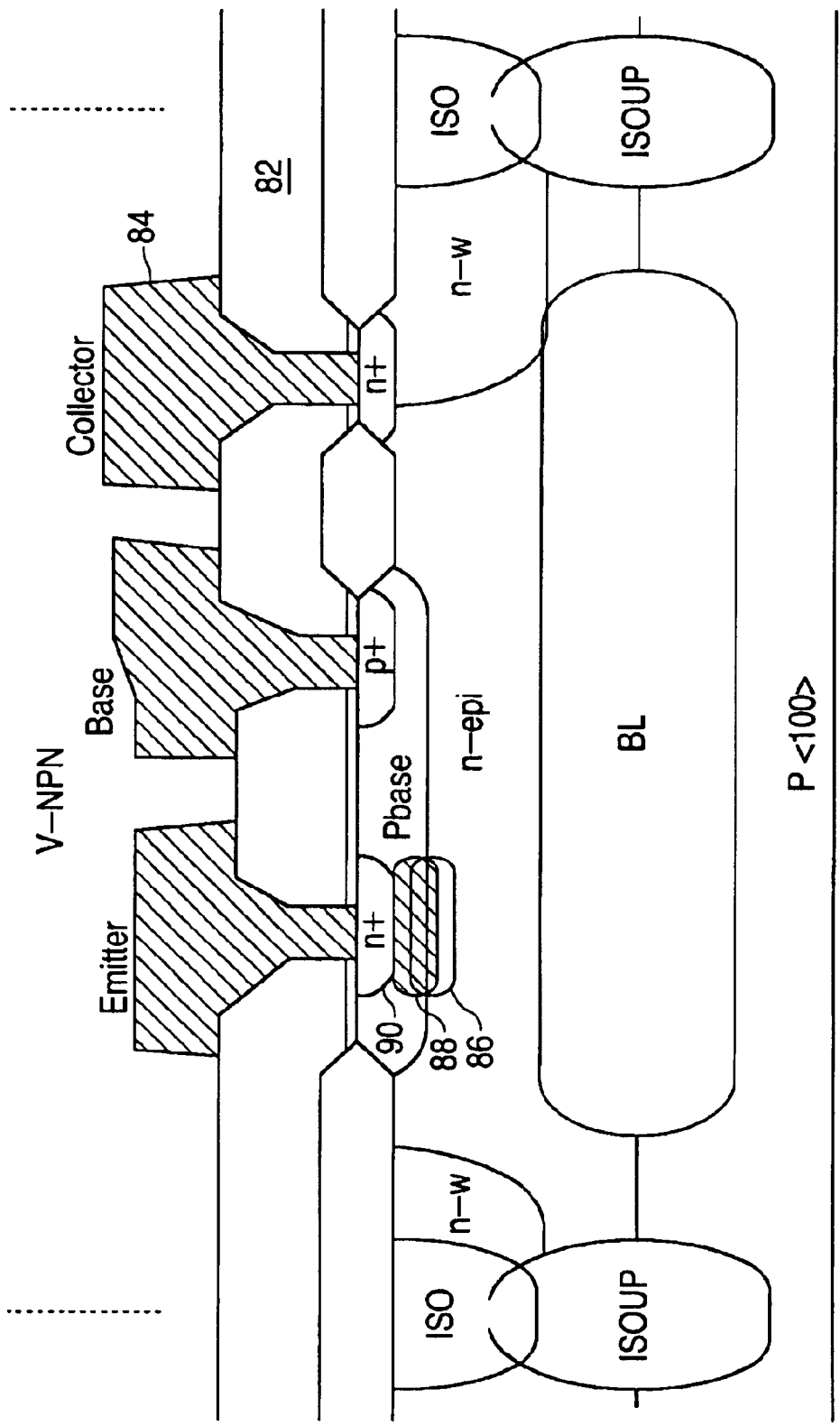
FIG. 11A is a cross-sectional view of the final structure of the VNPN transistor formed in accordance with the process described above.

FIG. 11A is a cross-sectional view of the final structure of the VNPN transistor formed in accordance with the process described above. Referring to FIG. 11A, a BPSG layer 82 has been formed over the semiconductor structure and contact openings have been made to the emitter regions, the base contact diffusion region and the collector diffusion region. A metallization layer 84 is deposited and patterned to form metal contacts to the respective emitter, base and collector regions of the VNPN transistor. The result of the triple implantation process forms a selective collector region 86 and an intrinsic base region 88, both aligned under emitter region 90. Moreover, selective collective region 86 overlaps intrinsic base region 88 in a way as to reduce the basewidth of the VNPN transistor.

Figure 11B:
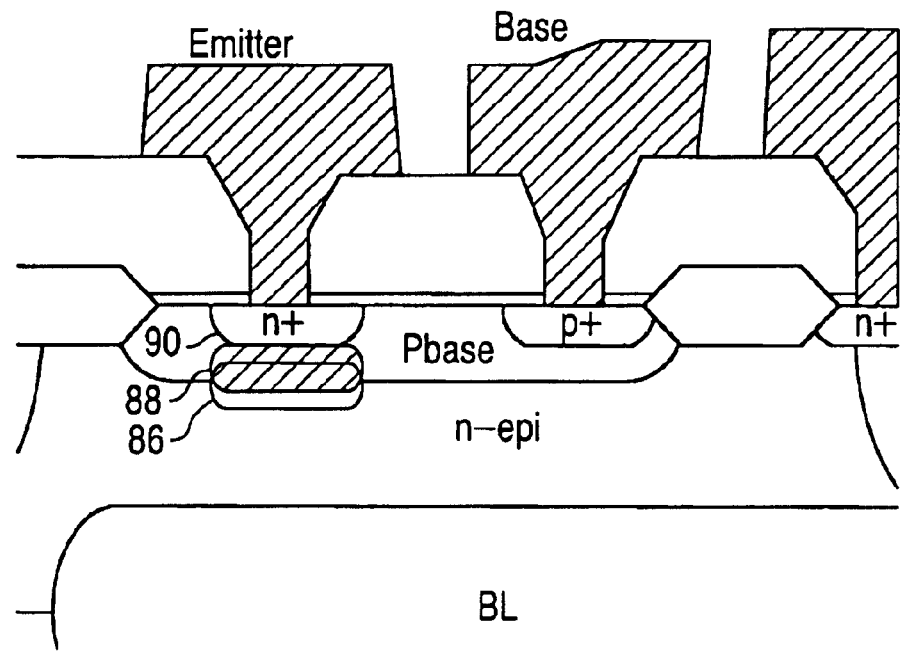
FIG. 11B is an enlarged cross-sectional view of the VNPN transistor of FIG. 11A.
Figure 11C:
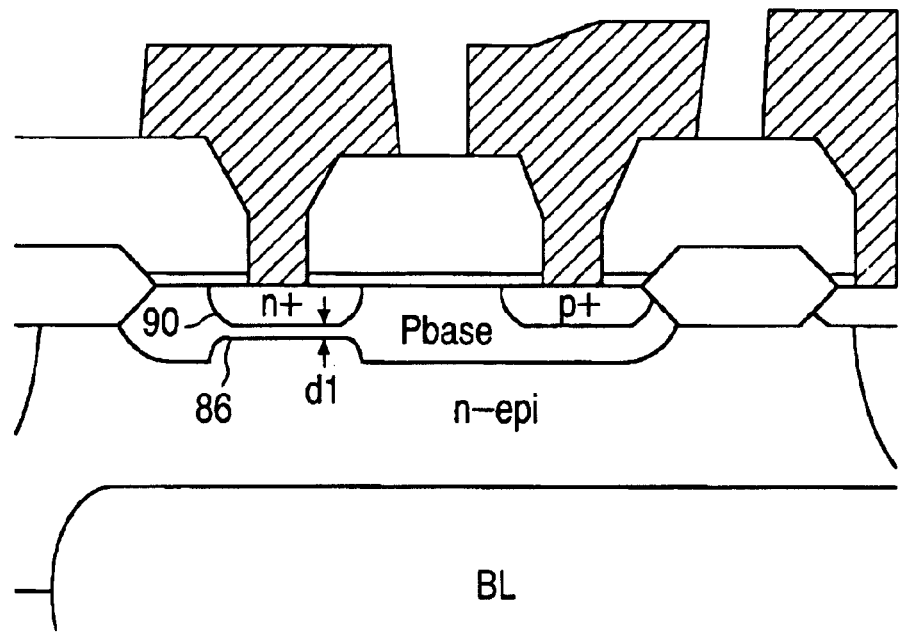
FIG. 11C is an enlarged cross-sectional view of the VNPN transistor of FIG. 11A illustrating the effective basewidth.

FIG. 11B is an enlarged cross-sectional view of the VNPN transistor of FIG. 11A for illustrating the regions formed by the triple implantation process. FIG. 11C is another enlarged cross-sectional view illustrating the effective basewidth formed as a result of the triple implantation process. As shown in FIG. 11B, selective collector region 86 overlaps intrinsic base region 88 so that the effective basewidth is reduced. Referring to FIG. 11C, the intrinsic base region of the VNPN transistor is bounded by selective collector region 86 and emitter region 90 and has a basewidth "d1" that is substantially smaller than the case where the base of the transistor extends to the bottom of P-base 50.

Figure 12A:
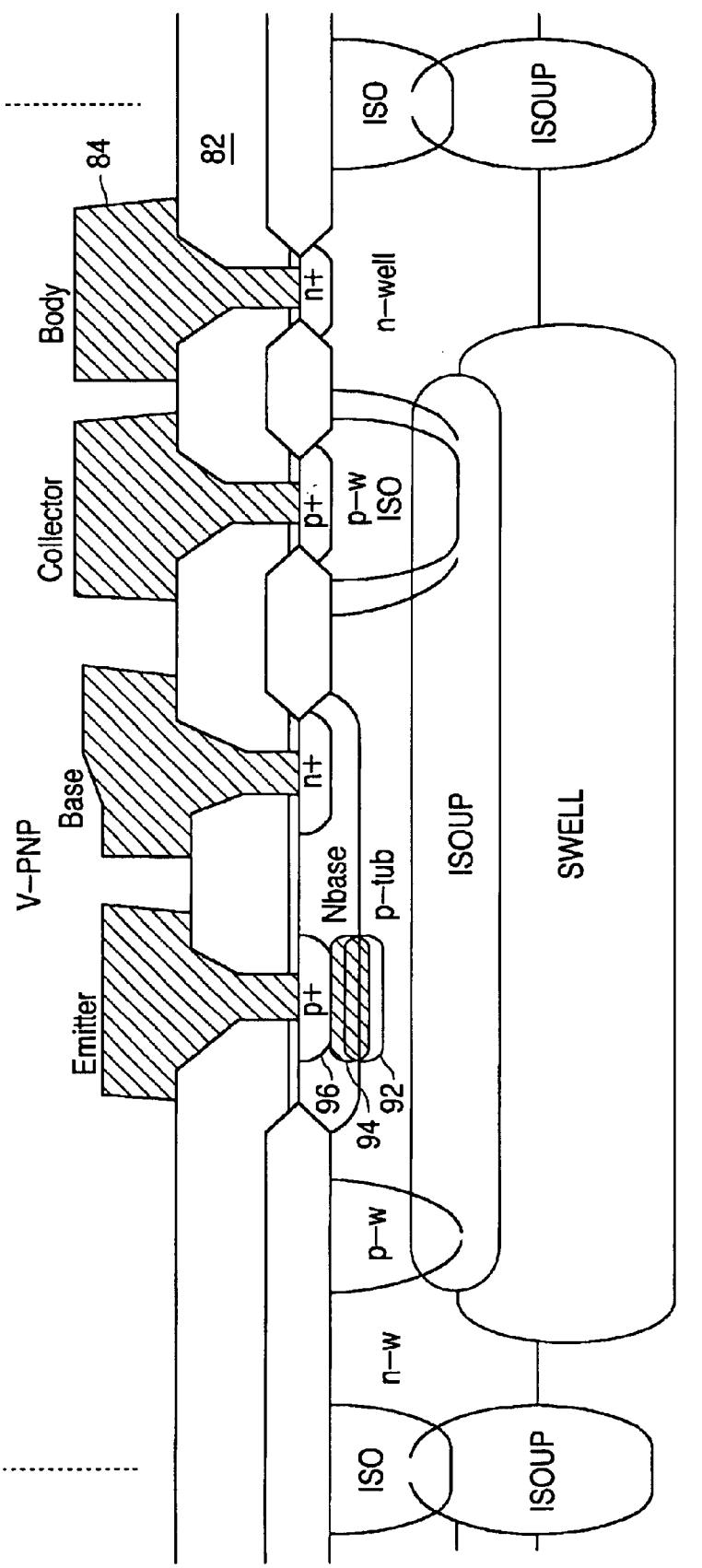
FIG. 12A is a cross-sectional view of the final structure of the VPNP transistor formed in accordance with the process described above.

FIG. 12A is a cross-sectional view of the final structure of the VPNP transistor formed in accordance with the process described above. The VPNP transistor also includes a BPSG layer 82 formed over the semiconductor structure and contact openings formed to allow metallization contacts to be made to the emitter region, the base contact diffusion region and the collector diffusion region. The result of the triple implantation process forms a selective collector region 92 and an intrinsic base region 94, both aligned under emitter region 96. Moreover, selective collective region 92 overlaps intrinsic base region 94 in a way as to further reduce the basewidth of the VPNP transistor.

Figure 12B:
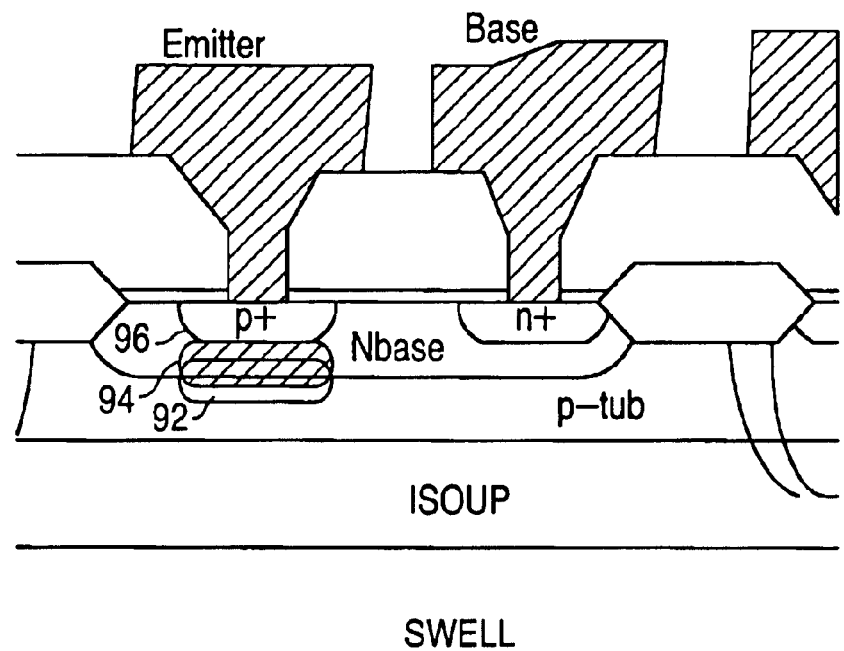
FIG. 12B is an enlarged cross-sectional view of the VPNP transistor of FIG. 12A.
Figure 12C:
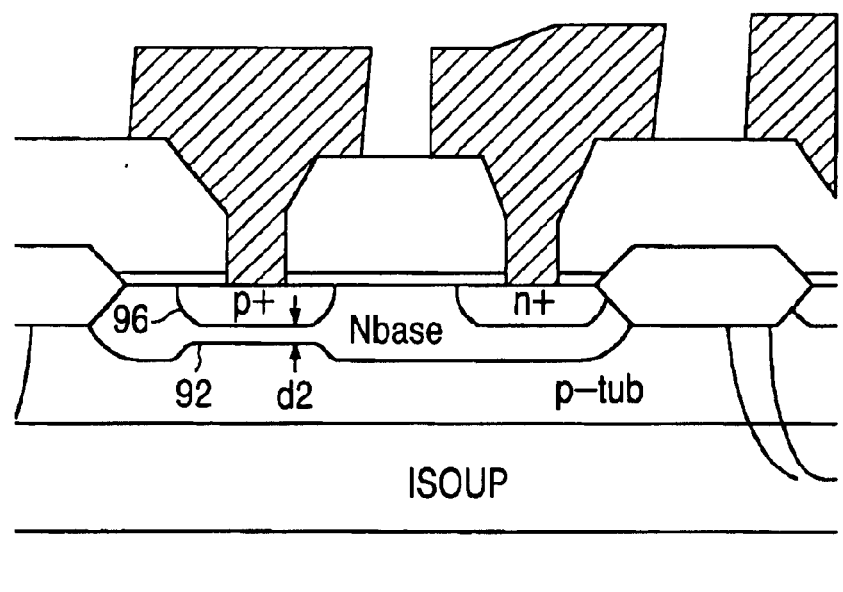
FIG. 12C is an enlarged cross-sectional view of the VPNP transistor of FIG. 12A illustrating the effective basewidth.

FIG. 12B is an enlarged cross-sectional view of the VPNP transistor of FIG. 12A for illustrating the regions formed by the triple implantation process. FIG. 12C is another enlarged cross-sectional view illustrating the effective basewidth formed as a result of the triple implantation process. As shown in FIG. 12B, the selective collector region 92 overlaps intrinsic base region 94 so that the effective basewidth is reduced. Referring to FIG. 12C, the intrinsic base region of the VPNP transistor is bounded by selective collector region 92 and emitter region 96 and has a basewidth "d2" that is substantially smaller than the case where the base of the transistor extends to the bottom of N-base 52.

Figure 13A:
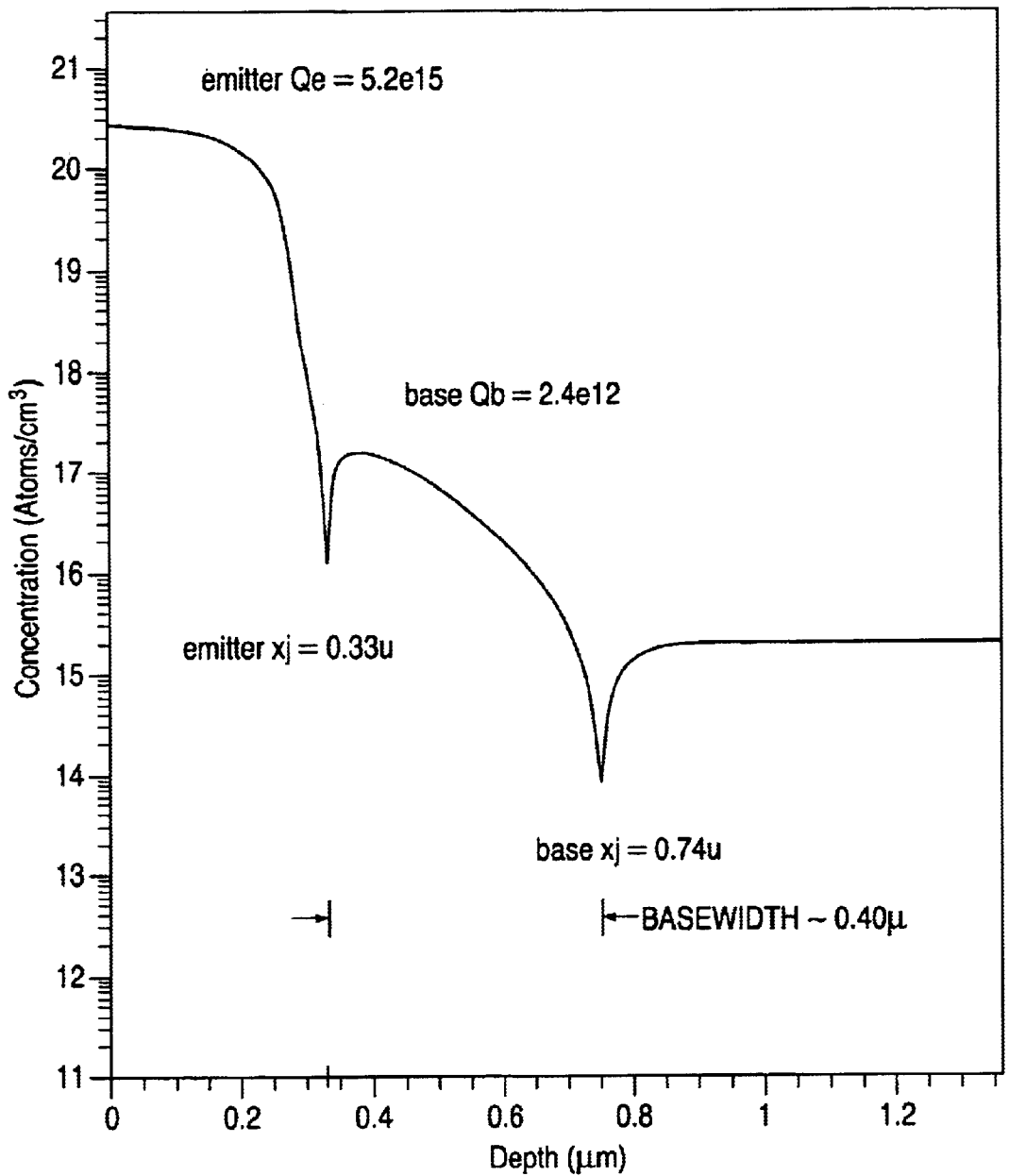
FIGS. 13A and 13B are doping profiles for a conventional VNPN transistor and a conventional VPNP transistor, respectively.
Figure 13B:
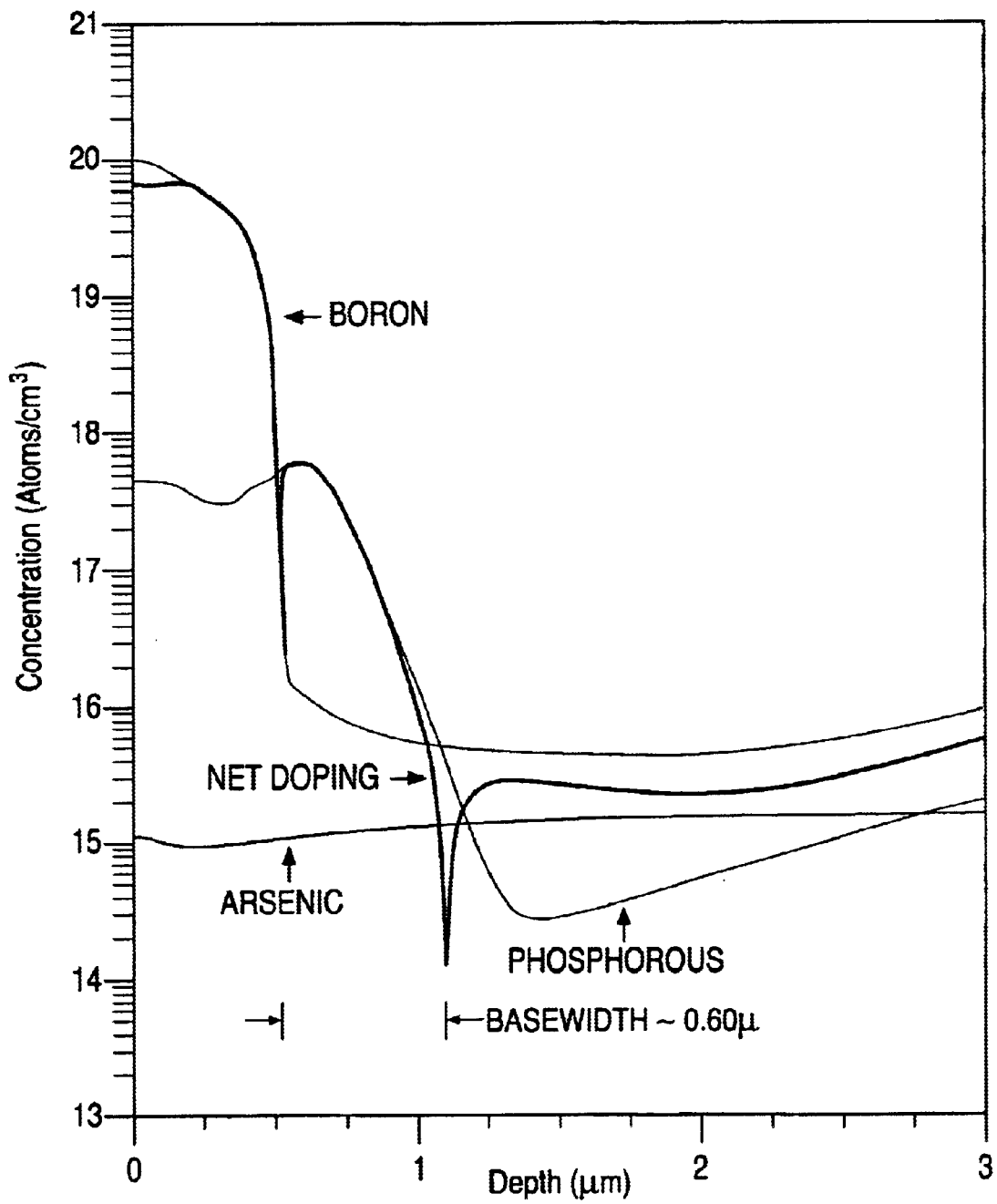
Figure 14A:
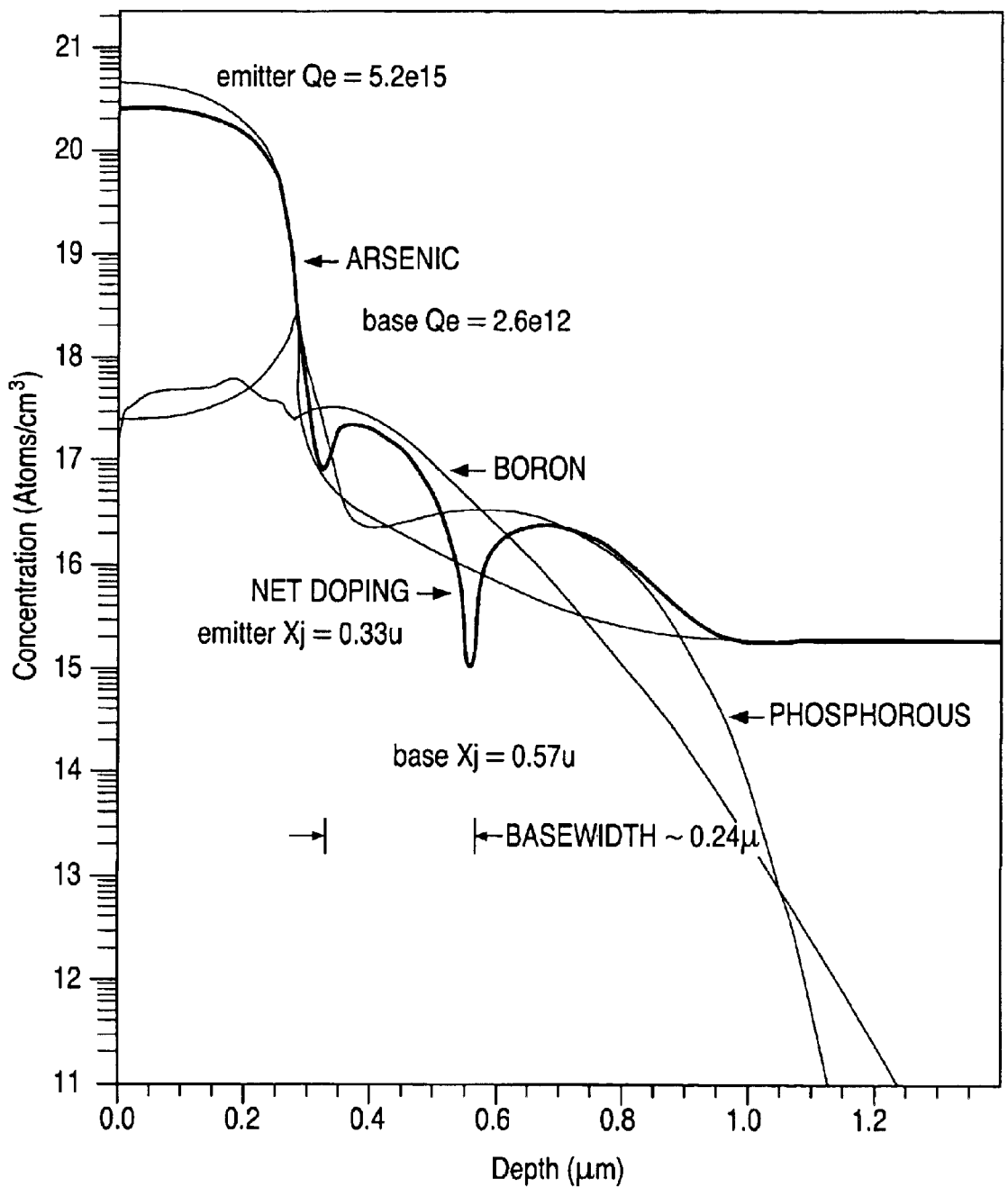
FIGS. 14A and 14B are doping profiles of a VNPN transistor and a VPNP transistor, respectively, manufactured using the triple implantation process in accordance with one embodiment of the present invention.
Figure 14B:
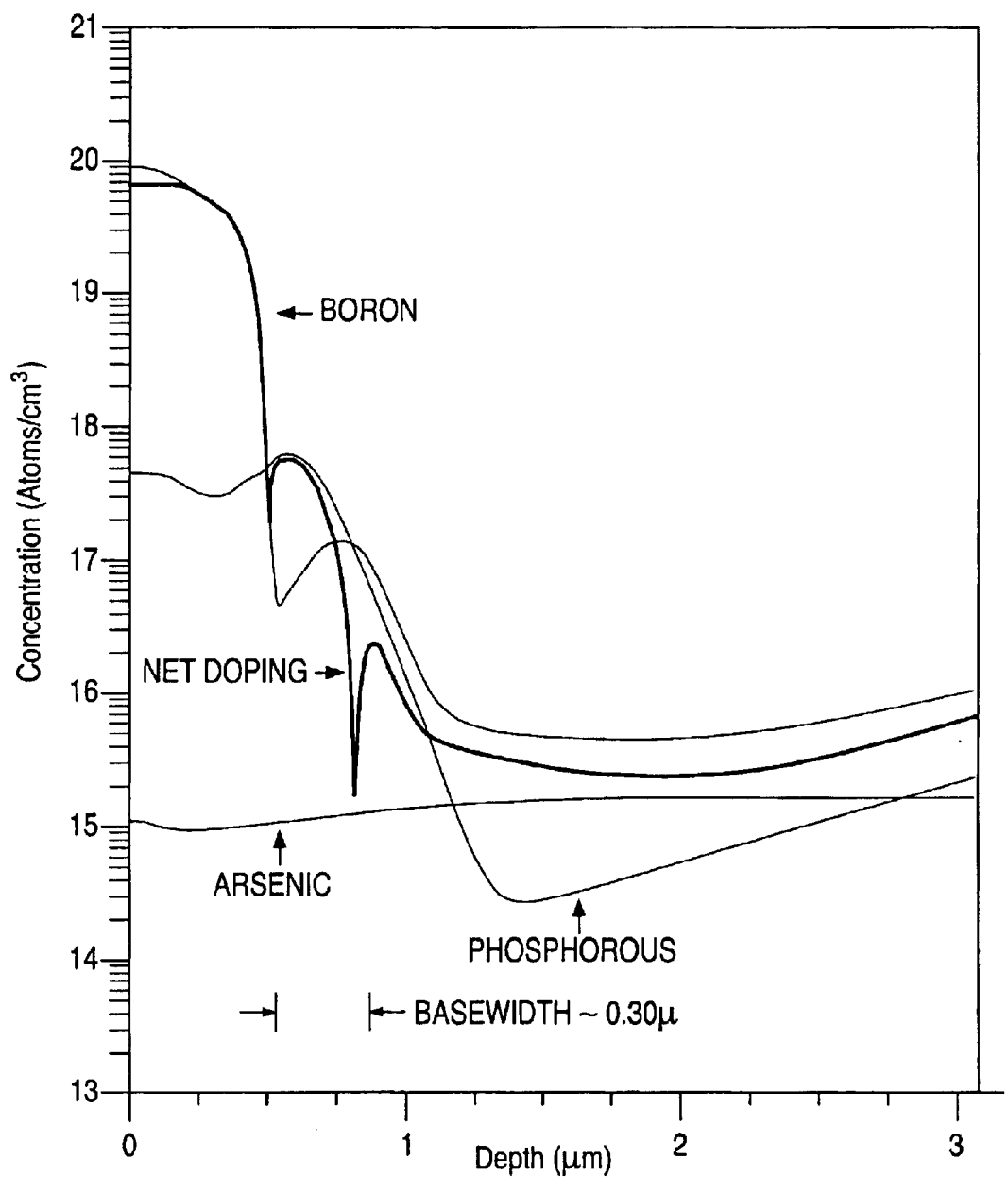

FIGS. 13A and 13B are doping profiles for a conventional VNPN transistor and a conventional VPNP transistor, respectively. FIGS. 14A and 14B are doping profiles of a VNPN transistor and a VPNP transistor, respectively, manufactured using the triple implantation process in accordance with one embodiment of the present invention. As observed from the doping profiles, a conventional VNPN transistor may have a basewidth of 0.4 µm and a conventional VPNP transistor may have a base width of 0.6 µm. However, when a selective collector implant (Kirk implant) is introduced, the effective basewidth can be significantly reduced. For example, under comparable processing conditions, a VNPN transistor according to the present invention can have an effective basewidth of only 0.24 µm (FIG. 14A) while a VPNP transistor according to the present invention can have an effective basewidth of only 0.30 µm (FIG. 14B).

The advantages of the triple implantation process for forming vertical bipolar transistors are numerous. First, the vertical bipolar transistors of the present invention can realize an improvement in cutoff frequency $f_T$ on the order of two times or more without any negative impact on other device characteristics. For instance, only minimal base capacitance is introduced because the more heavily doped intrinsic base region is limited to just under the emitter region.

Second, the $\beta^*Va$ product of the vertical bipolar transistors is increased, especially at high current and low $V_{CE}$ voltages. In one embodiment, a VPNP $\beta^*Va$ product of about 1800 at 1 ma and 10V $V_{CE}$ can be obtained. The triple implantation process effectively operates to "square-up" the otherwise Gaussian shaped base doping profile of the transistor and thereby improves the early voltage Va of the transistor by making it more difficult for the collector space-charge region to deplete into the base region.

Lastly, by introducing the Kirk implant, the Kirk effect (base-push out effect) is minimized such that transistor characteristics at high $V_{CE}$ voltage are not degraded as the current gain at low $V_{CE}$ voltages and high current is being improved.

The above detailed descriptions are provided to illustrate specific embodiments of the present invention and are not intended to be limiting. Numerous modifications and variations within the scope of the present invention are possible. The present invention is defined by the appended claims.

We claim:

1. A method for fabricating a bipolar transistor, comprising:

forming a first region of a first conductivity type in a semiconductor structure to form a collector region of the bipolar transistor;

forming a second region of a second conductivity type in the first region to form a base region of the bipolar transistor;

applying a first mask over the semiconductor structure, the first mask including an opening defining an emitter region of the bipolar transistor;

using the first mask, forming a third region of the first conductivity type in the semiconductor structure, the third region being formed in the first region and overlying the second region;

using the first mask, forming a fourth region of the second conductivity type in the semiconductor structure, the fourth region being formed in the second region and more heavily doped than the second region, a lower portion of the fourth region being overlaid by the third region; and using the first mask, forming a fifth region of the first conductivity type in the semiconductor structure, the fifth region being formed in the second region and above the fourth region as the emitter region of the bipolar transistor.

2. The method of claim 1, wherein forming a third region, a fourth region, and a fifth region comprise:

using the first mask, implanting dopants of the first conductivity type in the first region near the junction of the second region;

using the first mask, implanting dopants of the second conductivity type in the second region;

using the first mask, implanting dopants of the first conductivity type in the second region near a top surface of the semiconductor structure; and annealing the semiconductor structure to form the third region, the fourth region and the fifth region.

3. The method of claim 1, wherein the fourth region between the third region and the fifth region forms an intrinsic base region of the bipolar transistor, the width of the intrinsic base region defining the basewidth of the bipolar transistor, such that the width of the intrinsic base region is shorter than a distance between the bottom of the fifth region and the bottom of the second region.

4. The method of claim 1, wherein the first conductivity type is N-type and the second conductivity type is P-type.

5. The method of claim 4, wherein forming the first region comprises:

providing a semiconductor substrate;

forming a buried layer of the first conductivity type on the semiconductor substrate;

forming an epitaxial layer of the first conductivity type on the semiconductor substrate, the first region being formed in the epitaxial layer.

6. The method of claim 1, wherein the first conductivity type is P-type and the second conductivity type is N-type.

7. The method of claim 6, wherein forming the first region comprises:

providing a semiconductor substrate;

forming a first doped region of the first conductivity type on the semiconductor substrate;

forming an epitaxial layer of the second conductivity type on the semiconductor substrate;

forming a second doped region of the first conductivity type in the epitaxial layer, the second doped region contacting the first doped region, the second doped region forming the first region.

8. A bipolar transistor, comprising:

a first region of a first conductivity type formed in a semiconductor structure, the first region forming a collector region of the bipolar transistor;

a second region of a second conductivity type formed in the first region, the second region forming a base region of the bipolar transistor;

a third region of the first conductivity type formed in the second region, the third region forming an emitter region of the bipolar transistor;

a fourth region of the second conductivity type formed in the second region and being more heavily doped than the second region, the fourth region being aligned underneath and formed contiguous to the third region, the fourth region having substantially the same lateral dimensions as the third region; and a fifth region of the first conductivity type formed in the first region and overlying the fourth region, the fifth region being more heavily doped than the first region, the fifth region being aligned underneath and formed contiguous to the fourth region, the fifth region having substantially the same lateral dimensions as the third region.

9. The bipolar transistor of claim 8, wherein the third, fourth and fifth regions are formed by implantation using a first mask, the first mask defining an opening for the emitter region of the emitter region of the bipolar transistor.

10. The bipolar transistor of claim 8, wherein the fourth region between the third region and the fifth region forms an intrinsic base region of the bipolar transistor, the width of the intrinsic base region defining the basewidth of the bipolar transistor, such that the width of the intrinsic base region is shorter than a distance between the bottom of the third region and the bottom of the second region.

11. The bipolar transistor of claim 8, wherein the first conductivity type is N-type and the second conductivity type is P-type.

12. The bipolar transistor of claim 11, wherein the first region comprises an epitaxial layer of the first conductivity type formed on a semiconductor substrate.

13. The bipolar transistor of claim 8, wherein the first conductivity type is P-type and the second conductivity type is N-type.

14. The bipolar transistor of claim 13, wherein the first region comprises a doped region of the first conductivity type formed in a semiconductor substrate.

* * * * *